United States Patent
Ito et al.

(10) Patent No.: US 7,872,240 B2
(45) Date of Patent: Jan. 18, 2011

(54) CORRECTOR FOR CHARGED-PARTICLE BEAM ABERRATION AND CHARGED-PARTICLE BEAM APPARATUS

(75) Inventors: Hiroyuki Ito, Hitachinaka (JP); Yuko Sasaki, Mito (JP); Yoshiya Higuchi, Tokai (JP); Takeshi Kawasaki, Musashino (JP)

(73) Assignee: Hitachi High-Technologies Corporation, Tokyo (JP)

( * ) Notice: Subject to any disclaimer, the term of this patent is extended or adjusted under 35 U.S.C. 154(b) by 136 days.

(21) Appl. No.: 12/183,622

(22) Filed: Jul. 31, 2008

(65) Prior Publication Data
US 2009/0032722 A1 Feb. 5, 2009

(30) Foreign Application Priority Data
Jul. 31, 2007 (JP) ............................. 2007-198275

(51) Int. Cl.
*G21K 1/08* (2006.01)
*H01J 3/14* (2006.01)
*H01J 3/26* (2006.01)
*H01J 49/42* (2006.01)

(52) U.S. Cl. .......................... 250/396 R; 250/396 ML; 250/305; 250/306; 250/307

(58) Field of Classification Search ............. 250/396 R, 250/396 ML, 305–307; 850/9, 11
See application file for complete search history.

(56) References Cited

U.S. PATENT DOCUMENTS 4,251,728 A 2/1981 Pfeiffer et al.
4,303,864 A * 12/1981 Crewe et al. ............ 250/396 R
6,943,349 B2 * 9/2005 Adamec et al. ................ 850/9

OTHER PUBLICATIONS

Rose, H. "Outline of an ultracorrector compensating for all primary chromatic and geometrical aberrations of charged-particle lenses," Nuclear Instruments & Methods in Physics Research, A519, 2004, pp. 12-27.
M. Szilagyi, "Electron and Ion Optics," Microdevices: Physics and Fabrication Technologies New York: Plenum Press, 1988, s. 52-67, 118—ISBN 0-306-42717.6.
H. Rose et al., "Aberration Correction in Electron Microscopy," Proceedings of 2005 Particle Accelerator Conference, pp. 44-48.
German Office Action, w/ English translation thereof, Issued in German Patent Application No. 10 2008 035 297.7-54 dated Mar. 30, 2010.

* cited by examiner

*Primary Examiner*—Jack I Berman
*Assistant Examiner*—Meenakshi S Sahu
(74) *Attorney, Agent, or Firm*—McDermott Will & Emery LLP (57) ABSTRACT

In a charged-particle beam apparatus having a high-accuracy and high-resolution focusing optical system for charged-particle beam, a group of coils are arranged along a beam emission axis to extend through the contour of radial planes each radiating from the beam emission axis representing a rotary axis and each having a circular arc which subtends a divisional angle resulting from division of a circumferential plane by a natural number larger than 2 so that a superposed magnetic field may be generated on the incident axis of the charged-particle beam and the trajectory of the charged-particle beam may be controlled by the superposed magnetic field.

11 Claims, 9 Drawing Sheets

N=2 LINE SYSTEM

FIG. 1

N=2 LINE SYSTEM

FIG. 2

N=4 LINE SYSTEM

N=2 LINE SYSTEM

FIG. 4B

N=3 LINE SYSTEM

FIG. 4C

N=4 LINE SYSTEM

FIG. 4D

N=6 LINE SYSTEM

CORRECTOR FOR CHARGED-PARTICLE BEAM ABERRATION AND CHARGED-PARTICLE BEAM APPARATUS

FIELD OF THE INVENTION

The present invention relates to a aberration corrector for charged-particle beam in an optical system of charged-particle beam apparatus and a charged-particle beam apparatus provided with the aberration corrector.

BACKGROUND OF THE INVENTION

Of apparatus using a beam of electrons or ions which are a kind of charged-particles, a charged-particle beam apparatus such as an electron microscope for focusing and irradiating electrons on a specimen surface to form an image thereon, an electron beam exposure apparatus or an ion beam apparatus has been playing an important role in a wide technology field. For focusing a charged-particle beam in these apparatus, an electron lens comprised of electrodes or magnetic poles is used. In using the electron lens as above, there arises a problem of electro-optical aberration. Generally, in the electron lens constructed rotationally symmetrically, the focusing function increases at off-axis locations closer to the magnetic poles, enabling the electron lens to function as a concave lens. Further, the interaction of an electromagnetic field with the charged-particle beam causes a higher-order perturbation component leading to an aberration by which a charged-particle beam emitted from a certain point is caused to undergo slight dispersion depending on an incident condition to the lens as is known in the art. For these reasons, even with an ideal point light source, its emission angle distribution and center trajectory axis affect the image forming point to spread it finitely, thus bringing about a so-called beam blur. This type of aberration causes a degraded resolution and a serious cause of accuracy degradation in specimen observation and in fine working, respectively, both using the focused charged-particle beam.

In estimation of aberration in the rotationally symmetric system, the perturbation theory shows that for a small incident angle $\alpha$ making to the rotationally symmetric axis, there occur a spherical aberration proportional to the third power of $\alpha$ and a chromatic aberration proportional to a deviation dV of accelerating energy $-V$ and by neglecting off-axis and higher-order terms, a beam trajectory deviation $\delta$ on the axis can be expressed by $$\delta = Cs\alpha^3 + Cc(dV/V)\alpha \quad (1)$$

where Cs represents a spherical aberration coefficient and Cc represents a chromatic aberration coefficient. Equation 1 indicates that in the presence of beam current distribution and energy dispersion, a beam blur dependant on $\alpha$ takes place on the axis. Generally, in the charged-particle beam apparatus, the wider the extraction of the charged-particle beam emitted from the light source, the more the trajectory distribution in the focusing lens spreads to increase the amount of aberration. In order to decrease the aberration amount, a method is adopted according to which the electron lens impersonating a source of aberration is excited intensively to make short the focal point and the working length as well so as to reduce the trajectory dispersion, that is, blur.

In an alternative method for correction of this type of aberration, an aberration correction method has been proposed in which many stages of rotationally asymmetric multiple poles are arranged with a view to controlling the dispersion and focus (for example, see H. Rose, Nucl. Instrum. Meth., A519, 12). Specifically, a spherical aberration corrector using a system having four stages of 6-poles or 4-poles and three stages of 8-poles of magnetic field type arranged alternately or a chromatic/spherical aberration corrector based on an electromagnetic pole of 12 poles has been proposed.

Required for all electromagnetic poles constituting the multiple pole correction system as above are extremely high accuracies in mechanical working and arrangement. Correction of a fine aberration is vulnerable to the influence of noises and power supply variations and there need a variety of highly stable power supplies and adjustment measures. Further, in the magnetic field type using magnetic poles, an issue of magnetization hysteresis arises which is responsible for irregularities in characteristics. Especially, in the case of a projecting magnetic pole as possessed by the aberration corrector, a high permeability material used therefor gives a factor that induces a magnetic noise externally. On the other hand, in the electrostatic system, sophisticated insulating structures oppose a beam in vacuum, giving rise to contamination responsible for a drift the influence of which must be reduced for the purpose of practicing.

Because of the aforementioned problems of difficulties in technique and of high costs, the multiple pole correction system has till now been applied to only some types of electron microscope. In solving the above problems, a laborious technical task of realizing a multiple pole correction system capable of performing highly accurate adjustments inexpensively and easily comes up.

SUMMARY OF THE INVENTION

The present invention contemplates elimination of the problems the conventional error correction system faces in the rotationally symmetric system and it is an object of this invention to provide an inexpensive and highly accurate focusing optical system of high resolution for use with charged-particle beam.

According to the present invention, to accomplish the above object, a group of coils to be disposed along a beam emission axis are arranged to extend through the contour of radial planes each radiating from the beam emission axis representing a rotary axis and each having a circular arc which subtends a divisional angle resulting from division of a circumferential plane by a natural number larger than 2 so that a superposed magnetic field may be generated on the incident axis of the charged-particle beam and the trajectory of the charged-particle beam may be controlled by the superposed magnetic field.

According to the present invention, the problems encountered in the conventional aberration correction system in the rotationally symmetric system can be solved and an inexpensive and highly accurate focusing optical system of high resolution for use with charged-particle beam can be provided.

Other objects, features and advantages of the invention will become apparent from the following description of the embodiments of the invention taken in conjunction with the accompanying drawings.

DETAILED DESCRIPTION OF THE EMBODIMENTS

Generally, for a beam deflector of, for example, an electron beam drawing apparatus required of reproducibility and uniform magnetic field, an air-core coil of distributed winding is employed. In a multiple pole system for aberration correction, too, a similar effect can be expected by structuring multiple poles with winding coils without resort to magnetic poles. In other words, by abolishing the magnetic pole and by establishing a correction magnetic field through the use of the simple winding, the influence of hysteresis and working accuracy of the magnetic pole can be eliminated. In addition, by maintaining vacuum environing the beam path in the corrector with a pipe-shaped non-magnetic material and suppressing gas discharge, contamination can also be reduced. Since the magnetic field does not act on a charged-particle beam having a velocity of 0 (zero), the influence of insulating foreign matters mixed during production can be reduced and stability against unwanted electrification can be expected.

A solution to the problem of cost and workability depends on how the correction field, that is, the multiple pole field can be set up with simplified winding. An example of a wiring line to this effect will be shown below. A current flow line arranged linearly in parallel to the beam axis and assumed to be of infinite length is now considered. A magnetic field H at a point distant by L from the linear current I is given by $$H = I/(2\pi L) \quad (2)$$

Figure 1:
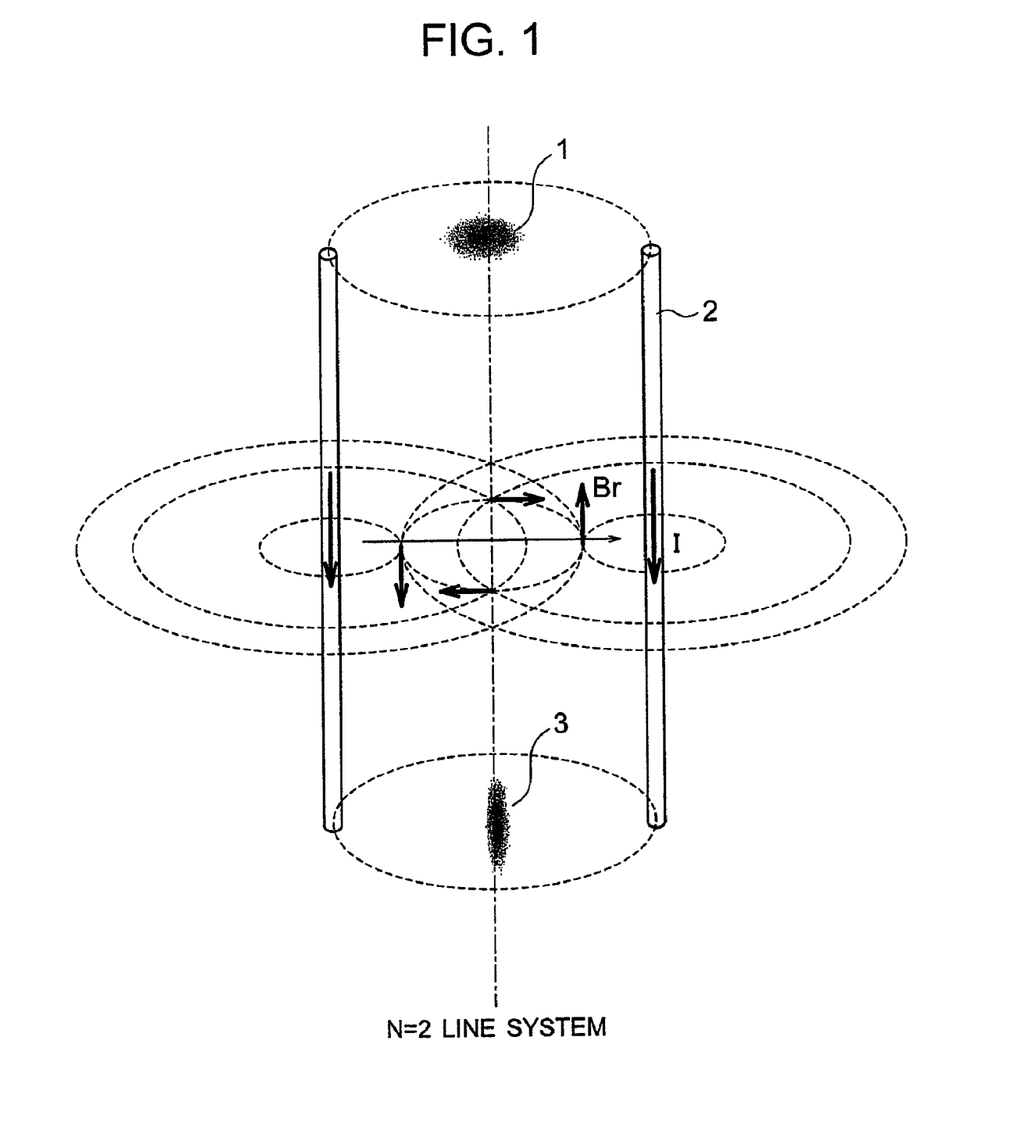
FIG. 1 is a perspective view showing a structure of a coil system.

Referring now to FIG. 1 illustrating a structure of coil system in perspective view form, an instance will be considered in which coils 2 of a coil system of line number N=2 are arranged symmetrically to the axis of beam 1 at radial positions of radius R. Assuming a distance of r toward the coil 2 from the beam 1 and the paraxial condition of r<<R, a magnetic field Br can be approximated by $$Br = (I/2\pi)\{1/(R-r) - 1/(R+r)\} \approx Ir/(\pi R^2) \quad (3)$$

Similarly, a magnetic filed Br orthogonal to the coil 2 is given by $$Br \approx -Ir/(\pi R^2) \quad (4)$$

Figure 2:
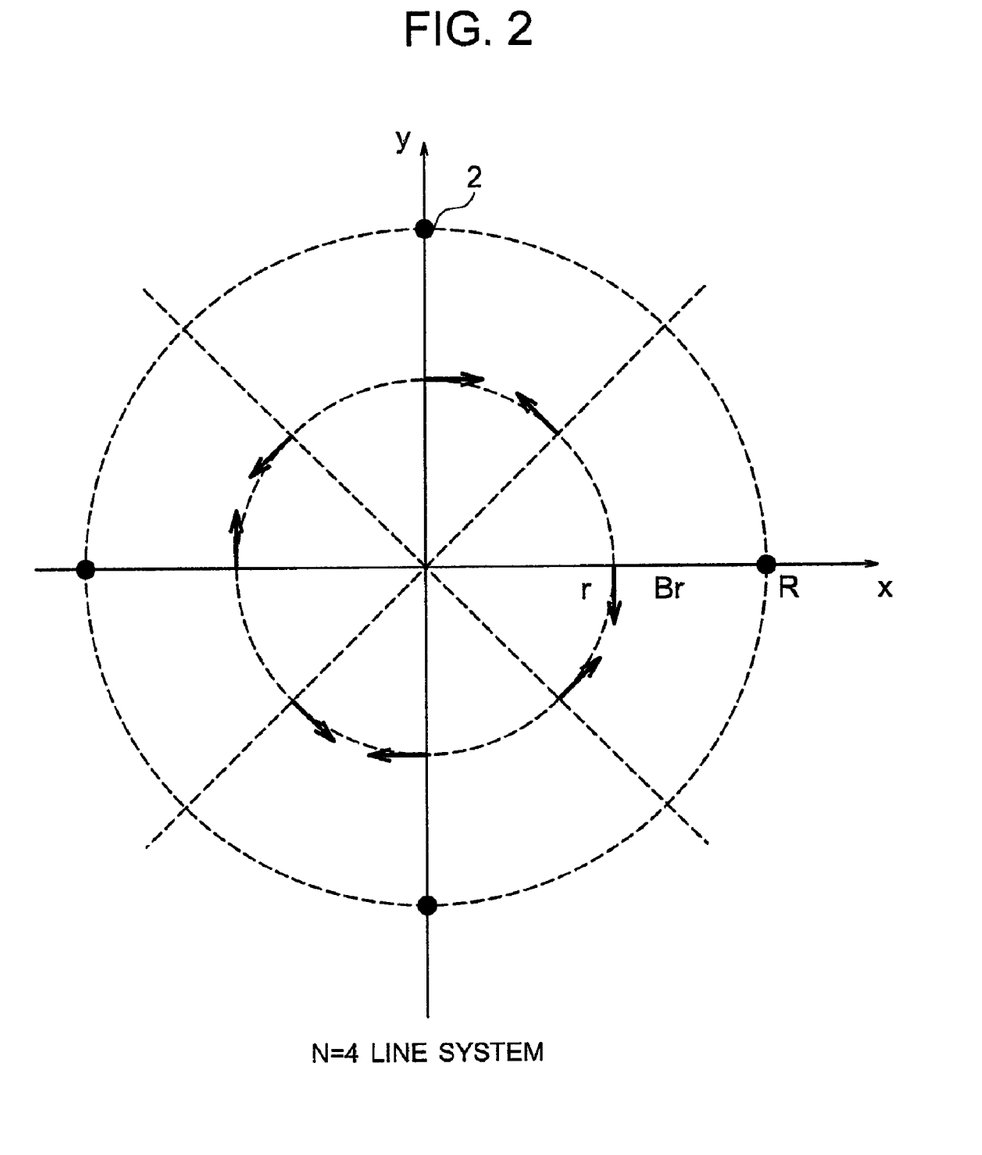
FIG. 2 is a plan view of the coil system structure as seen from above.

It is herein of importance that the magnetic fields given by equations 3 and 4 are canceled in radial direction components and excited mutually inverse rotational directions. As will also be seen, the paraxial magnetic field distribution provides a quadrupole linearly proportional to r. To describe more specifically, when a circular beam 1 is incident to or enters the coil system of coils 2 of FIG. 1, an astigmatic action exerted by the magnetic field in the direction of coils 2 and in a direction orthogonal thereto, with the result that a projection image 3 is deformed. Turning to FIG. 2, another coil structure is seen from above in the plan view form, illustrating 4-line coil system 2 in contrast to the 2-line coil system 2 of FIG. 1. As will be seen from the figure, a rotary magnetic field Br acts as an octupole in this instance.

Figure 3:
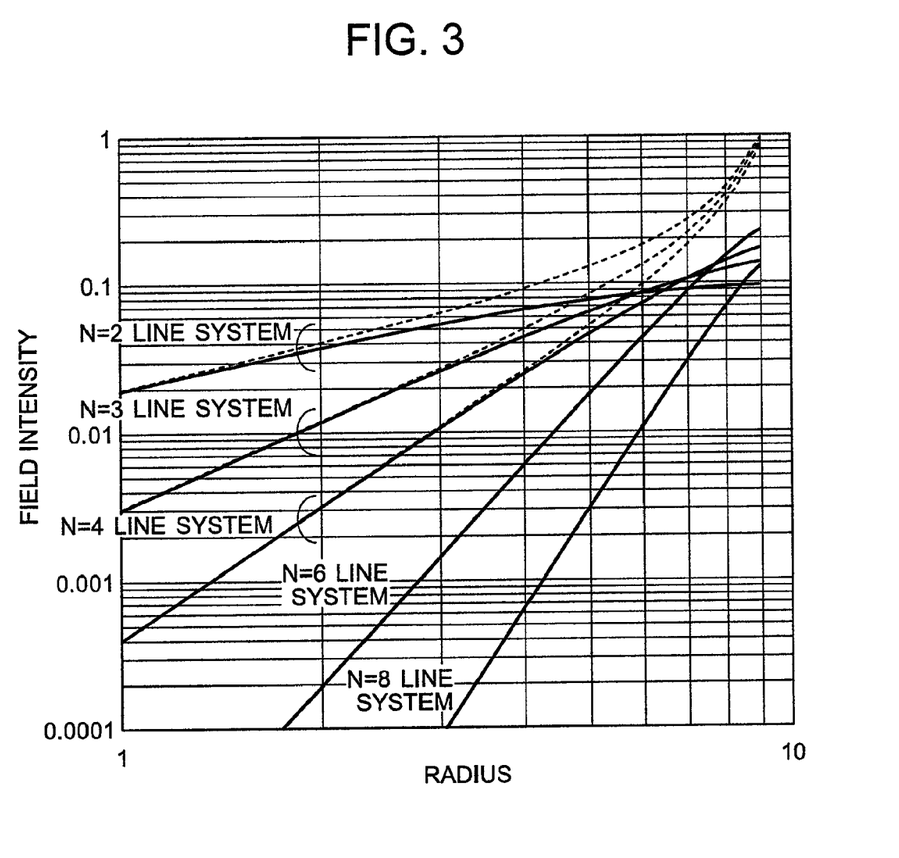
FIG. 3 is a graph showing the relation between the number of lines N of coil system and the intensity of magnetic field.
Figure 4A:
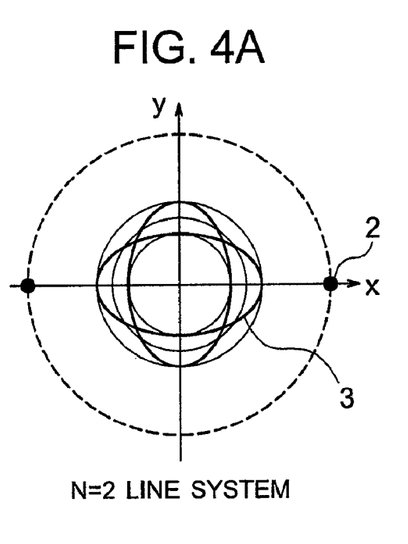
FIGS. 4A to 4D are plan views of coil system structures as seen from above.
Figure 4B:
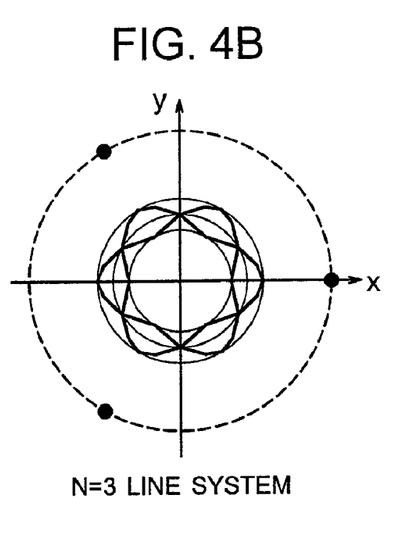
Figure 4C:
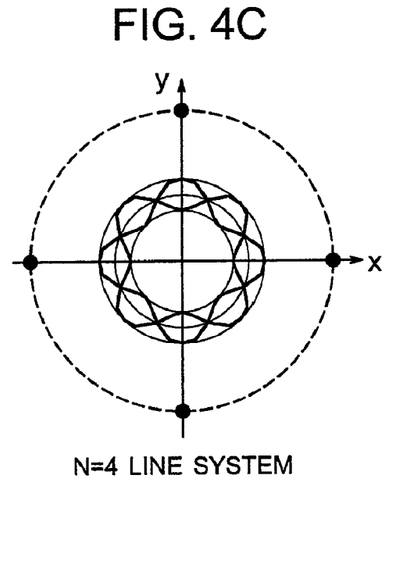
Figure 4D:
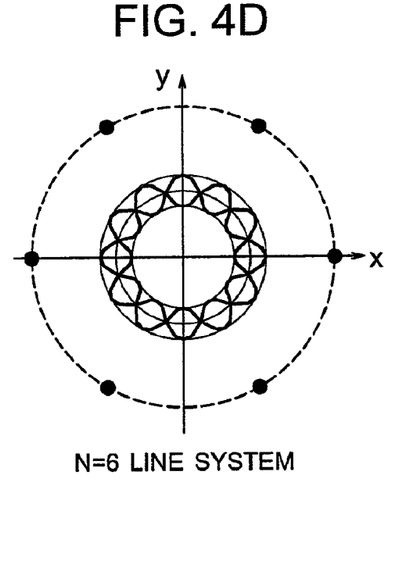

The relation between the number of coil lines N and the magnetic field intensity is graphically illustrated in FIG. 3. The number of lines N of coils 2 is changed in connection with the relation indicated by equation 2 and magnetic fields are then calculated at locations in the directions of coils from the beams axis and circumferentially equidistantly divided locations. Abscissa represents radius from the center axis of beam and ordinate represents the magnetic field intensity. As the number of lines N increases, the order increases and the gradient of line segment on the graph becomes steep. It will be seen that in the N=4 system, there occurs a magnetic field distribution of octupole which increases depending on the same cubic term as that of spherical aberration shown in equation 1.

In conclusion, by making the number of lines N=2, 3, 4 and 6, the aforementioned magnetic quadruple pole, hexapole, octupole and duopole which are respectively important for aberration correction can be realized as described previously. Then, each of the field distributions provides a rotating magnetic field about the axis of the beam and can directly apply a stronger focus action than that by the usual rotationally symmetric lens. Coil structures similar to that of FIG. 2 are illustrated as viewed from above together with a projection image 3 in plan view form in FIGS. 4A to 4D which concern the 2-line system, 3-line system, 4-line system and 6-line system, respectively. Convergence/divergence of the projection image changing as a dual undulation pattern according to the current direction is diagrammatically illustrated in accordance with the number of lines N of coils 2. To sum up, a group of coils to be disposed along a beam emission axis are arranged to extend through the contour of radial planes each radiating from the beam emission axis representing a rotary axis and each having a circular arc which subtends a divisional angle resulting from division of a circumferential plane by a natural number larger than 2 so that a superposed magnetic field may be generated on the incident axis of the charged-particle beam and the trajectory of the charged-particle beam may be controlled by the superposed magnetic field, thereby providing a corrector for correcting the charged-particle beam for its aberration.

By exchanging the conventional multiple pole system with the simple parallel current lines, an economical corrector can be realized. More specifically, for aberration correction used normally, the quadruple and octupole poles can be replaced with N=2 line system and N=4 line system, respectively, the hexapole system can be replaced with N=3 line system and the duopole system can be replaced with N=6 line system.

Embodiment 1

On the basis of the aforementioned principle, a first embodiment of the present invention will now be described. While the present embodiment will be described as using electrons representing charged-particles, the corrector of the present invention can also be applied to the use of ions representing positive charged-particles. Further, as an example of application of the aberration corrector, part of an embodiment being applied mainly to magnetic quadruple, octupole and electromagnetic superposition duople will be described in brief but application of them in combination with a doublet lens hexapole system, an electrostatic type corrector and the like can also be possible.

Figure 5:
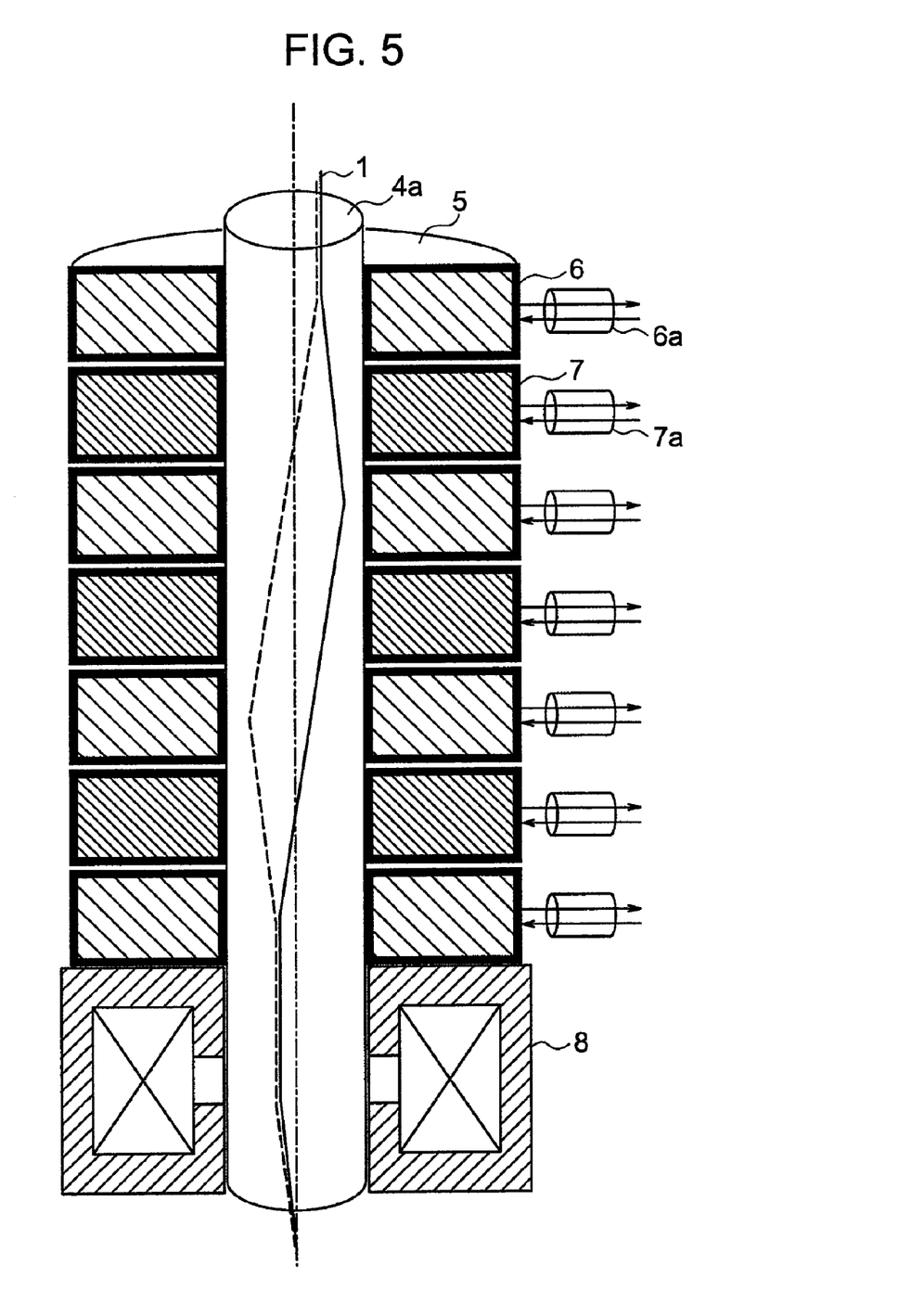
FIG. 5 is a perspective view, sectioned longitudinally, showing a configuration of arrangement of coils.

Referring to FIG. 5, a configuration of arrangement of coils is illustrated in a longitudinally sectioned perspective view form. A line is wound toroidally on a ring-shaped bobbin 5 surrounding a vacuum pipe 4a to form a coil and the coils are stacked to form a coil system. Structurally, the bobbin 5 is movable in the vertical direction in relation to the main axis of a beam 1 while keeping the interior of the non-magnetic vacuum pipe 4 arranged centrally of the coil vacuumed. This ensures that axial alignment of the bobbin 5 with the trajectory of the beam 1 can be achieved. Mechanically, the coils can freely be rotated and positioned vertically in the atmospheric ambience. When the current flowing to the coil is turned off, the action of coil is deactivated and therefore, a common preliminary line can be provided in advance in consideration of mechanical working error, easiness of adjustment and mass production. In addition, in order to facilitate the adjustment and reduce an influence of parasitic aberration, the back of the coils is positioned as remotely from the beam 1 as possible.

Specifically, in the example of FIG. 5, 2-line system coil 6 of N=2 and 4-line system coil 7 of N=4 are stacked alternately to structure a quadruple pole system and an octupole system so as to correct spherical aberration. Through the action explained in connection with FIG. 3 and FIGS. 4A to 4D, the idea similar to the conventional aberration correction based on the system of multiple poles can be utilized as will be described below. The beam 1 first enters the first stage of 2-line system coil 6, undergoes different actions of focus and divergence in the orthogonal direction by the action of the quadruple pole field, and are displaced to trajectories indicated by solid line and dotted line, respectively. The subsequent stage of 4-line system coil 7 forms an octupole filed and the beam 1 receives a strong defection action in solid line direction passing off-axially, being hardly affected by deflection in dotted line direction. The beam 1 further undergoes the deflection action by the 4-line system coils 7 of middle and lower stages, thereby being affected resultantly, so that a negative spherical aberration coefficient can be generated in total in an arbitrary direction. Then, each working amount and each working distance are set and adjusted such that a positive spherical aberration coefficient of a rotationally symmetrical focusing lens 8 of the lowermost stage can be cancelled. Further, electrically conductive films 6a and 7a are laid on the insulating layer surfaces of wiring of the 2-line system coil 6 and 4-line system coil 7, respectively, to provide individual coaxial shield portions by which noises originating from the wiring can be prevented.

Figure 6:
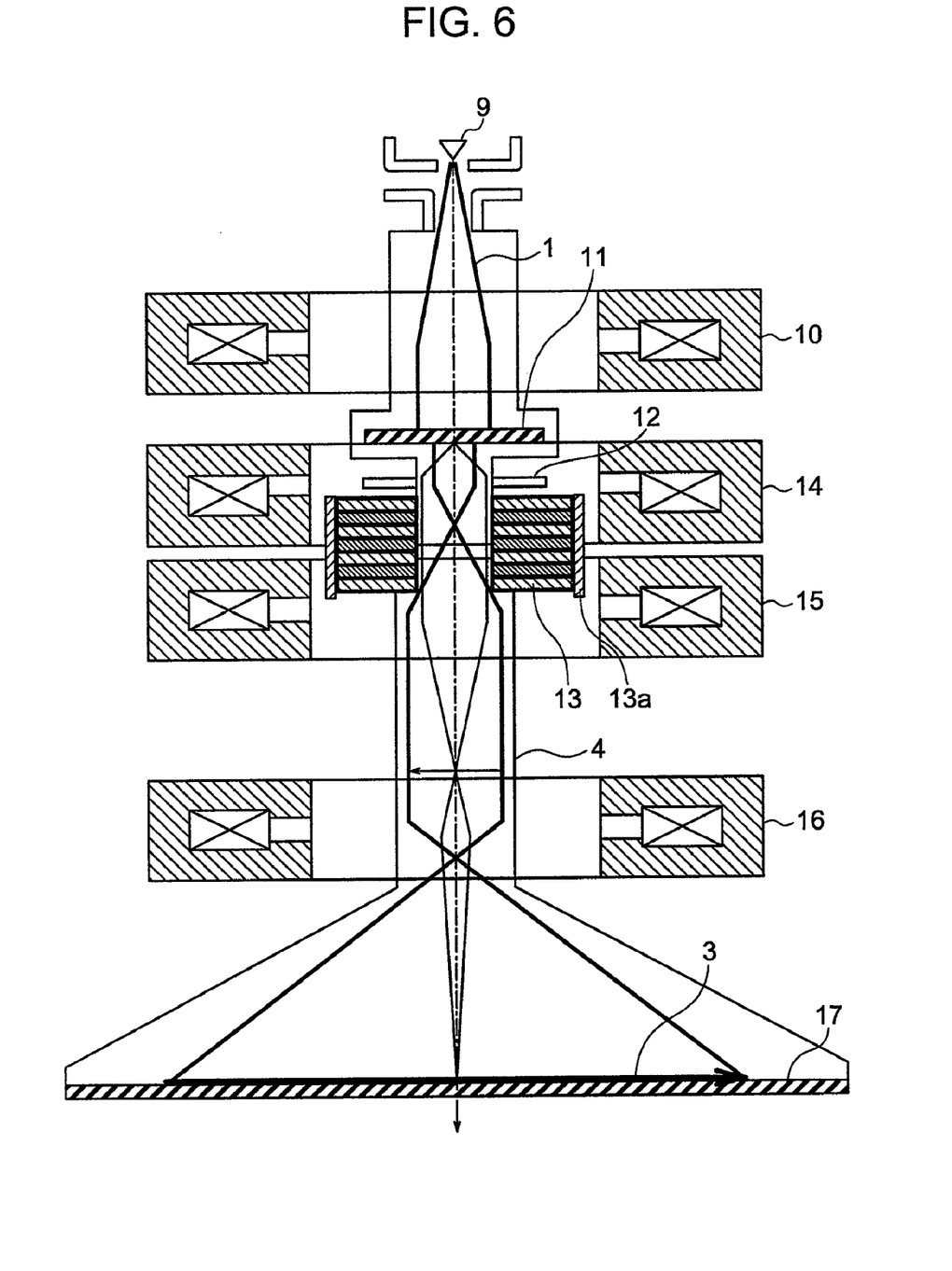
FIG. 6 is a longitudinally sectional view showing the principal part of a transmission type electron microscope.

Referring to FIG. 6, the principal part of a transmission type electron microscope is illustrated in longitudinal sectional form to show an example where the structure according to the present invention is incorporated in the transmission type electron microscope. An electron beam 1 emitted from an electron source 9 is converged by an incident lens 10 and irradiated on a specimen 11. Under the specimen 11, a limiting aperture 12 for obtaining a desired contrast is provided. The electron beam having transmitted through the specimen 11 is focused by an objective lens 14 and a limiting aperture 12 and is caused to enter a winding corrector 13 in substantially parallel relationship thereto. Then, a negative spherical aberration is generated, so that a spherical aberration of the objective lens 14 can be compensated and cancelled. An intermediate lens 15 and a projection lens 16 act on the electron beam further and a projection image 3 is formed on a fluorescent screen 17.

In FIG. 6, the winding corrector 13 does not use any magnetic material at all and advantageously, it can hardly be affected by hysteresis and interference with unwanted electromagnetic fields. With a magnetic field shield 13a arranged around the winding corrector 13, efficient magnetic field shielding can be achieved. Further, by applying voltage to the vacuum pipe 4, the operational sensitivity of the winding corrector 13 can be adjusted. The present embodiment has been described by way of example of the transmission type electron microscope but since it is sufficient that the winding corrector 13 is provided merely with the vacuum pipe for environing the trajectory of beam in vacuum and is simply disposed in a gap between the vacuum pipe and the lens, the present embodiment can also be applied to scanning transmission type electron microscope, scanning electron microscope, focused ion beam working apparatus and so on.

Embodiment 2

Figure 7:
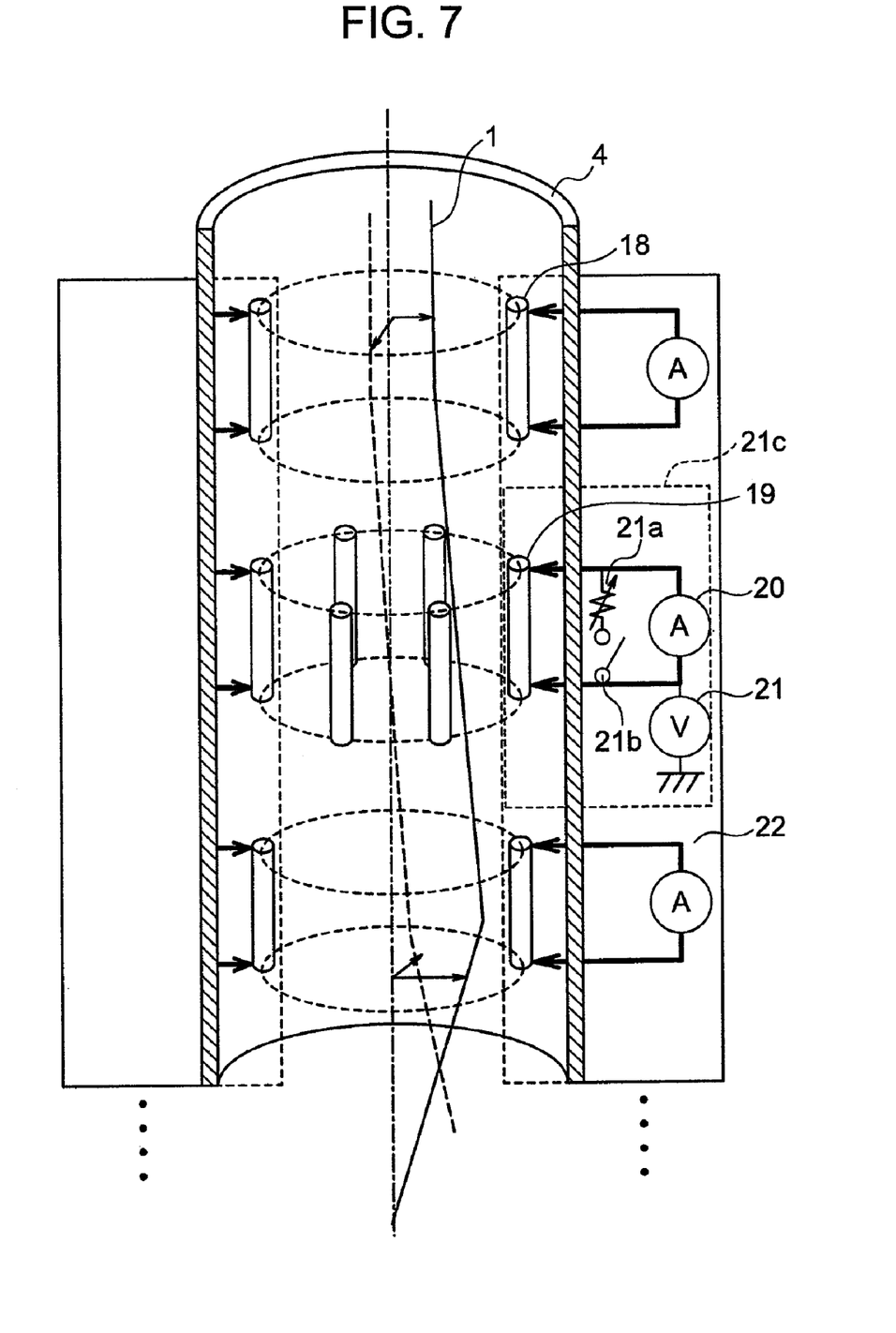
FIG. 7 is a perspective view, sectioned longitudinally, showing a schematic configuration of a vacuum pipe and a corrector.

A second embodiment of the invention will be described hereunder. A vacuum pipe and a corrector are configured as schematically illustrated in FIG. 7 in longitudinally sectional perspective view form. The corrector is structured to have an electromagnetic type duopole correction system as partly illustrated. In FIG. 7, semiconductor substrates 22 each formed with a wiring pattern and a power supply circuit are connected to a non-magnetic vacuum pipe 4 for maintaining vacuum radially of the vacuum pipe. In the duopole system in which in addition to the spherical aberration, the chromatic aberration is also corrected by utilizing the action difference due to electromagnetic force, superposition of magnetic field action and electric field action is necessary. Therefore, in the structure shown in FIG. 7, a 2-line coil including a bipolar line 18 for separating the trajectory of beam 1, a 6-line coil including a hexapole line 19 for obtaining the duopole action, a current amplifier 20 for applying exciting current to the 6-line coil, a voltage source 21 for application of bias voltage, a current distribution resistor 21a and a circuit element 21b inclusive of a connection switch are mounted.

According to the electron/optics similarity law, it is known that in the magnetic field type coil as described previously, constriction of current magnitude and coil size at a constant ratio can provide the same beam trajectory. Recent advancement of MEMS (Micro-Electro-Mechanical Systems) work technology makes fine wiring work possible and therefore, if wiring in the order of several 10 µm can be produced by using, for example, the technique of finely working the magnetic head and semiconductor, the corrector can be miniaturized drastically and further the beam trajectory can be controlled with a low current source. Most advantageously, the production of the winding corrector can take the advantage of production of a coil in the form of a wiring pattern on a printed substrate or a semiconductor substrate.

As shown in FIG. 7, the winding correction system especially using magnetic fields alone can be formed as wiring on a dotted-line extension surface 21c of the semiconductor substrate 22. If this wiring can be formed as micro wiring through the recent lithography technique, not only reduction in power supply capacity can be assured but also compatibility between high sensitivity of corrector and its high accuracy can be attained. In addition, a coaxial shield structure can also be available through the use of the technique for multiplayer of semiconductor and hence the influence of noise can also be reduced. Even with a high acceleration beam requiring highly stable large current, heat dissipation to the atmosphere can be facilitated and the thermal capacity can be decreased through the use of the corrector structured as shown in FIG. 7. Further, by structuring the corrector such that it can be cooled with a refrigerator, super-stable large current based on superconductivity can be obtained.

As for costs, the individual coils shown in FIG. 5 or 7 can be connected in series or the magnetic field intensity can be adjusted by the number of turns to thereby save the number of power supplies. Also, by adjusting the exciting current with the help of resistors connected in parallel with the individual coils, the number of power supplies and the costs of parts can be reduced. Further, because of the absence of hysteresis in principle, all correctors can be adjusted for the number of turns and the winding direction and thereafter connected so as to be operated with high reproducibility by the use of only one power supply.

Practically, the axial misalignment between beam and corrector attributable to errors in dimension of winding of the corrector is of a serious problem but such a problem can be handled easily. A portion of the corrector through which the beam passes is constructed as schematically shown in perspective view form in FIG. 8. Since a magnetic field generated in the winding system amounts to superposition of individual winding turns, the relative displacement to the beam 1 can be dealt with by passing a current in opposition to the deflection action through an aligner deflector 24. In the case of the 4-line system, an opposite current adapted to cause deflection action in the relative direction may be passed. In the case of 2-line system, the 4-line system is formed in advance and by correcting the 4-line system for deflection action and astigmatic aberration action, electrical alignment can be achieved to cope with the beam axis misalignment.

Figure 8:
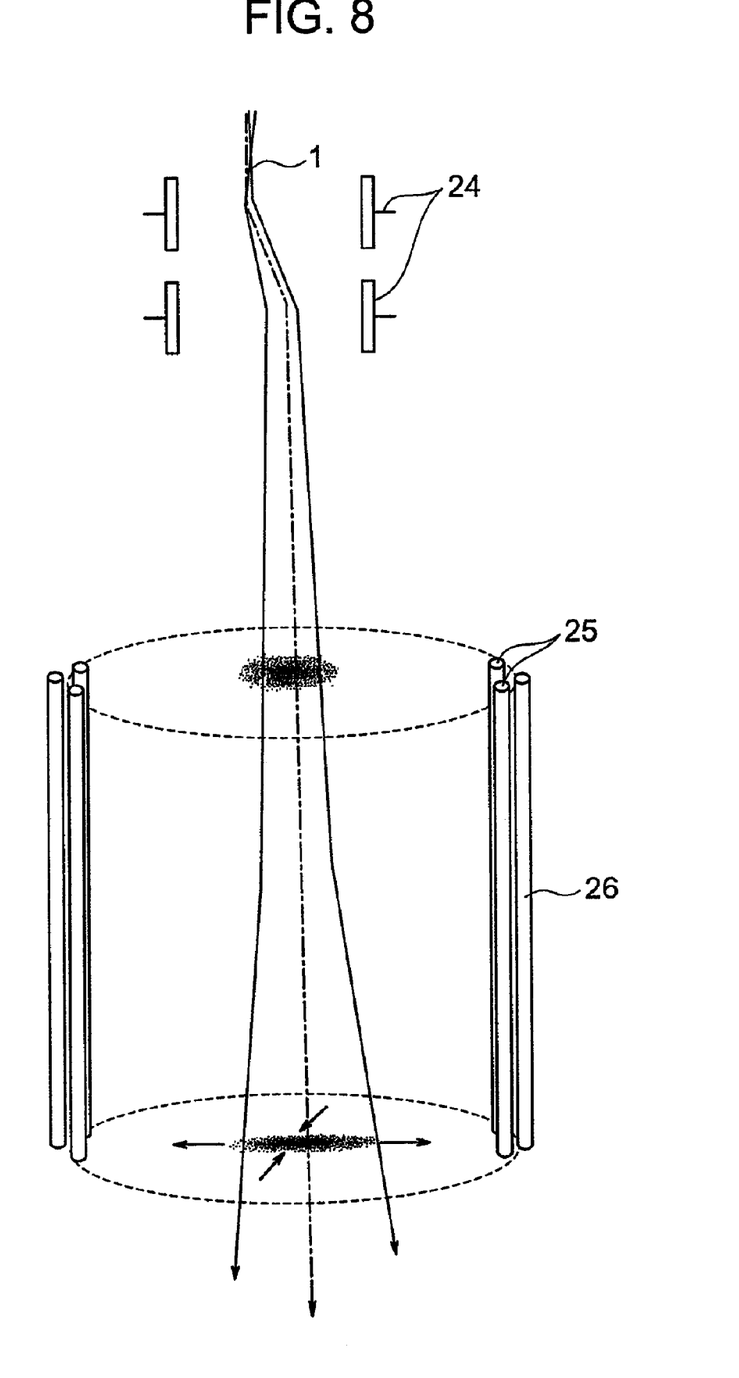
FIG. 8 is a perspective view showing a schematic configuration of a portion where the beam passes through the corrector.

Further, an auxiliary current line 26 is arranged closely to main current lines 25 at apices of a triangle and the axial misalignment can be corrected using the auxiliary current line 26. Depending on the amount and direction of current in the auxiliary current line 26 positioned on the right and left sides of the main current lines 25, the axis of beam can be moved right and left and back and forth in terms of vector.

Figure 9:
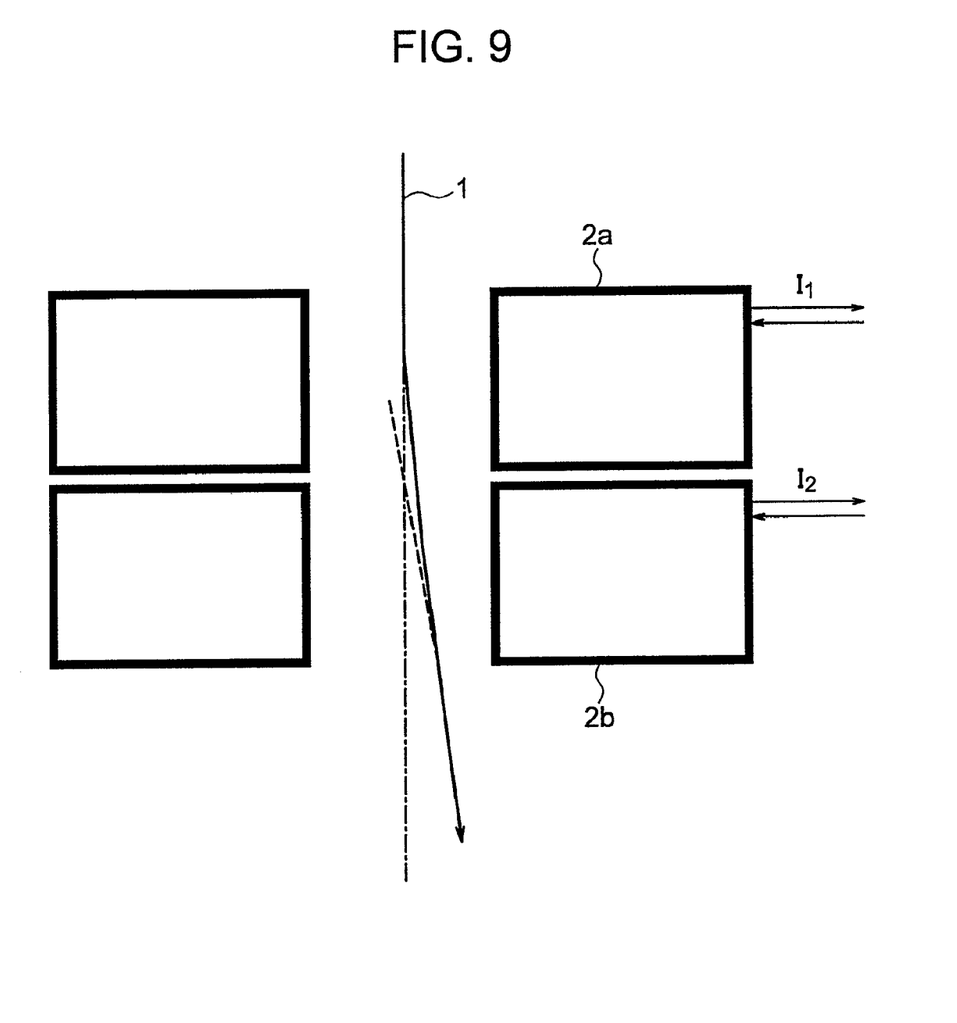
FIG. 9 is a longitudinally sectional view diagrammatically illustrating the beam and coils.

In the ordinary multi-pole system, the incident position and deflection sensitivity can be adjusted but the working center cannot be controlled. Accordingly, when the cross point of beam is not at a theoretical location, individual adjustments are difficult to achieve. In the winding scheme, however, the working center can be adjusted relatively freely. Namely, to this end, two stages of coils are arranged and amounts of currents to be supplied to them are adjusted. Structural relation between the beam and the coil is diagrammatically illustrated in longitudinal sectional form in FIG. 9. As will be seen from the figure, by passing currents $I_1$ and $I_2$ independently to coils 2a and 2b of two stages, a cross point of an azimuth angle as viewed in the emission direction of beam 1 and the axis, that is, working center position can be adjusted easily.

As has been described hereinbefore, according to the embodiments of the present invention, the correction of the aberration of charged-particle beam having suitability for general use of, for example, aberration correction can be realized with extreme compactness inclusive of the power supply and at low costs. Consequently, an inexpensive and highly accurate focusing optical system of high resolution for use with charged-particle beam which can solve the problems the conventional aberration correction system in the rotationally symmetrical system encounters can be provided.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A charged-particle beam aberration corrector for correcting the aberration of a charged particle beam emitted from a charged-particle beam source, comprising:
a group of coils with parallel current lines arranged along a beam emission axis to extend through the contour of radial planes each radiating from the beam emission axis representing a rotary axis and each having a circular arc which subtends a divisional angle resulting from division of a circumferential plane by a natural number larger than 2 so that a superposed magnetic field may be generated on the incident axis of the charged-particle beam and the trajectory of the charged-particle beam may be controlled by the superposed magnetic field.

2. A charged-particle beam aberration corrector according to claim 1, wherein a plurality of stages of coils each subject to the same divisional angle or different divisional angles are arranged in series and each of the coils generates a superposed magnetic field in association with each stage to control the trajectory of the charged-particle beam.

3. A charged-particle beam aberration corrector according to claim 1, wherein the coils are connected in series to generate a resultant superposed magnetic field by which the trajectory of the charged-particle beam is controlled.

4. A charged-particle beam aberration corrector according to claim 1, wherein currents to the coils are controlled independently and the trajectory of the charged-particle beam is controlled by superposed magnetic fields generated by said coils.

5. A charged-particle beam aberration corrector according to claim 1, wherein current lines inside the coils are controlled independently and the trajectory of the charged-particle beam is controlled by superposed magnetic fields generated by said coils.

6. A charged-particle beam aberration corrector according to claim 1, wherein a current line, an exciting current amplifier, a voltage source for setting coil potential and a circuit element including a current distribution resistor and a connection switch are arranged on a semiconductor substrate and they are connected through a wiring pattern to provide an integrated circuit.

7. A charged-particle beam aberration corrector according to claim 1, wherein a magnetic shield is arranged peripherally of the coils.

8. A charged-particle beam aberration corrector according to claim 1, wherein a non-magnetic vacuum pipe is arranged internally of said coils.

9. A charged-particle beam aberration corrector according to claim 1, wherein electrically conductive films are formed on insulating layer surfaces of wiring of said coils, respectively, to provide coaxial shield elements.

10. A charged-particle beam apparatus having a focusing optical system for focusing a charged-particle beam emitted from a charged-particle beam source on a specimen, wherein said focusing optical system includes magnetic field lenses and a charged particle beam aberration corrector, said charged-particle beam aberration corrector having a group of coils with parallel current lines, arranged along a beam emission axis to extend through the contour of radial planes each radiating from the beam emission axis representing a rotary axis and each having a circular arc which subtends a divisional angle resulting from division of a circumferential plane by a natural number larger than 2 so that a superposed magnetic field may be generated on the incident axis of the charged-particle beam and the trajectory of the charged-particle beam may be controlled by the superposed magnetic field.

11. A charged-particle beam apparatus according to claim 10 further comprising a rotationally symmetric control electrode arranged internally of said coils, wherein said control electrode generates an electromagnetic field on an axis coincident with said focusing optical system to control the trajectory of the charged-particle beam passing through said control electrode.

* * * * *